(12) United States Patent
Johnson et al.

(10) Patent No.: US 10,351,431 B2
(45) Date of Patent: Jul. 16, 2019

(54) LARGE-SCALE GRAPHENE SHEET: ARTICLES, COMPOSITIONS, METHODS AND DEVICES INCORPORATING SAME

(75) Inventors: Alan T. Johnson, Philadelphia, PA (US); Zhengtang Luo, Rocky Hill, CT (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 38 days.

(21) Appl. No.: 13/814,888

(22) PCT Filed: Aug. 11, 2011

(86) PCT No.: PCT/US2011/047369
§ 371 (c)(1),
(2), (4) Date: Apr. 23, 2013

(87) PCT Pub. No.: WO2012/021677
PCT Pub. Date: Feb. 16, 2012

(65) Prior Publication Data
US 2013/0217222 A1    Aug. 22, 2013

Related U.S. Application Data

(60) Provisional application No. 61/372,589, filed on Aug. 11, 2010.

(51) Int. Cl.
*C01B 32/186* (2017.01)
*B82Y 30/00* (2011.01)
(Continued)

(52) U.S. Cl.
CPC ............ *C01B 32/186* (2017.08); *B82Y 30/00* (2013.01); *B82Y 40/00* (2013.01); *C01B 32/194* (2017.08);
(Continued)

(58) Field of Classification Search
CPC .............. C01B 31/0453; C01B 32/186; C01B 2204/02
See application file for complete search history.

(56) References Cited

U.S. PATENT DOCUMENTS 7,115,221 B1    10/2006  Spahr et al.
9,388,048 B1 *   7/2016  Zhou ....................... C01B 31/04
(Continued)

FOREIGN PATENT DOCUMENTS

EP    2 327 661 A1    6/2011
EP    2 327 662 A1    6/2011
(Continued)

OTHER PUBLICATIONS

Yu, Qingkai, et al. "Graphene synthesis by surface segregation on Ni and Cu." arxiv0804 (1778).*
(Continued)

*Primary Examiner* — Daniel Luke
(74) *Attorney, Agent, or Firm* — BakerHostetler

(57) ABSTRACT

Provided are methods for growing large-size, uniform graphene layers on planarized substrates using Chemical Vapor Deposition (CVD) at atmospheric pressure; graphene produced according to these methods may have a single layer content exceeding 95%. Field effect transistors fabricated by the inventive process have room temperature hole mobilities that are a factor of 2-5 larger than those measured for samples grown on commercially-available copper foil substrates.

15 Claims, 10 Drawing Sheets

(51) Int. Cl.
 B82Y 40/00 (2011.01)
 H01L 21/02 (2006.01)
 H01L 29/16 (2006.01)
 H01L 21/285 (2006.01)
 C01B 32/194 (2017.01)
 H01L 29/778 (2006.01)

(52) U.S. Cl.
 CPC ...... *H01L 21/0243* (2013.01); *H01L 21/0262* (2013.01); *H01L 21/02425* (2013.01); *H01L 21/02527* (2013.01); *H01L 21/02658* (2013.01); *H01L 21/28506* (2013.01); *H01L 29/1606* (2013.01); *C01B 2204/02* (2013.01); *C01B 2204/20* (2013.01); *C01B 2204/32* (2013.01); *H01L 29/7782* (2013.01)

(56) References Cited

U.S. PATENT DOCUMENTS

| | | | |
|---|---|---|---|
| 2006/0286025 | A1 | 12/2006 | Spahr et al. |
| 2008/0217622 | A1* | 9/2008 | Goyal ........................ 257/64 |
| 2009/0011204 | A1* | 1/2009 | Wang ................ B82Y 40/00 428/215 |
| 2009/0068471 | A1 | 3/2009 | Choi et al. |
| 2009/0110627 | A1* | 4/2009 | Choi ................ B82Y 30/00 423/447.1 |
| 2009/0140801 | A1 | 6/2009 | Ozyilmaz et al. |
| 2009/0155561 | A1 | 6/2009 | Choi et al. |
| 2010/0021708 | A1* | 1/2010 | Kong ................ B82Y 30/00 428/220 |
| 2010/0051897 | A1 | 3/2010 | Chen et al. |
| 2010/0089996 | A1 | 4/2010 | Koplar |
| 2010/0127312 | A1 | 5/2010 | Grebel et al. |
| 2010/0224851 | A1 | 9/2010 | Colombo et al. |
| 2011/0104442 | A1 | 5/2011 | Yoon et al. |
| 2012/0161098 | A1* | 6/2012 | Hiura ............... C23C 16/0218 257/9 |

FOREIGN PATENT DOCUMENTS

| | | |
|---|---|---|
| JP | 2010-089996 A | 4/2010 |
| WO | WO 2009-119641 | 10/2009 |
| WO | WO 2009/129194 A2 | 10/2009 |
| WO | WO 2011-046415 | 10/2011 |

OTHER PUBLICATIONS

Cao, Helin, et al. "Wafer-scale graphene synthesized by chemical vapor deposition at ambient pressure." arXiv preprint arXiv:0910.4329 v1.*
arXiv.org Primer.*
Bhaviripudi et al, "Role of Kinetic Factors in Chemical Vapor Deposition Synthesis of Uniform Large Area Graphene Using Copper Catalyst", Nano Lettters, Sep. 2, 2010, 10, 4128-4133.
Kang et al, "Monolayer Graphene Growth on Sputtered Thin Film Platinum", Journal of Applied Physics, Feb. 5, 2009, 106(10), 104309-1-104309-6.
Obraztsov et al, "Chemical Vapor Deposition of Thin Graphite Films of Nanometer Thickness", Carbon, 45, Jun. 24, 2007, 2017-2021.
Novoselov, K. S et al., "Electric Field Effect in Atomically Thin Carbon Films", Science, Oct. 22, 2004, 306(5696), 666-669.
Berger, C. et al., "Electronic Confinement and Coherence in Patterned Epitaxial Graphene", Science, May 26, 2006, 312(5777), 1191-1196.
Emtsev, K. V. et al., "Towards wafersize graphene layers by atmospheric pressure graphitization of silicon carbide", Nature Materials, Feb. 8, 2009, 8(3), 203-207.
Marchini, S. et al., "Scanning tunneling microscopy of graphene on Ru(0001)", Physical Review B, Aug. 28, 2007, 76(7), 075429-1-075429-9.
Loginova, E. et al., "Evidence for graphene growth by C cluster attachment", New J. of Phys. Sep. 2008, 10, 1-16.
Sutter, P. W. et al., "Epitaxial Graphene on Ruthenium", Nat. Mater. Published online: Apr. 6, 2008, 7(5), 406-411.
Yu, Q. et al., "Graphene Segregated on Ni Surfaces and Transferred to Insulators", Applied Physics Letters, Published Online: Sep. 15, 2008, 93(11), 113103-3.
Reina, A. et al., "Large Area, Few-Layer Graphene Films on Arbitrary Substrates by Chemical Vapor Deposition", Nano Lett. Dec. 1, 2009, 9(1), 30-35.
Kim, K. S. et al., "Large-Scale Pattern Growth of Graphene Films for Stretchable Transparent Electrodes", Nature, Feb. 5, 2009, 457(7230), 706-710.
Li, X. et al., "Large-Area Synthesis of High-Quality and Uniform Graphene Films on Copper Foils," Science, Jun. 5, 2009, 1312-1314.
Cao, H. et al., "Wafer-Scale Graphene Synthesized by Chemical Vapor Deposition at Ambient Pressure", arXiv.org, e-Print Arch., 2009, 1-19.
Shivareddy, S. et al., "The Analysis of the Cu Surface Morphology Evolution During Electropolishing", ECS Trans. 2008, 13(4), 21-32.
Li, X. et al., "Evolution of Graphene Growth on Ni and Cu by Carbon Isotope Labeling", Nano Lett., Published online: Aug. 27, 2009, 9(12), 4268-4272.
Ferrari, A. C. et al., "Raman Spectrum of Graphene and Graphene Layers", Phys. Rev. Lett. Oct. 30, 2006, 97, (18), 187401.
Hirsch, J. ; Lucke, K., "Mechanism of deformation and development of rolling texture in polycrystalline fcc metals . I. Description of rolling texture development in homogeneous CuZn alloys", Acta Metall., Nov. 1988, 36(11), 2863-82.
Yudasaka, M. et al., "Graphite Formation on Ni Film by Chemical Vapor Deposition", Thin Solid Films, Jul. 1996, 280(1-2), 117-123.
Johansson, A.-S. et al., "TEM Investigation of CVD Graphite on Nickel", Thin solid films, Nov. 15, 1994, 252, 19-25.
Novoselov, K. S. et al., "Two-Dimensional Atomic Crystals", Proc. Natl. Acad. Sci., Jul. 26, 2005, 102(30), 10451-10453.
Irving, S.M.; Walker, P. L., "Interaction of Evaporated Carbon With Heated Metal Substrates", Carbon, Sep. 1967, 5(4), 399-400.
Chen, et al, "Contrast Behaviors in the Adsorption, Diffusion, Nucleation, and Growth of Carbon Adatoms on Stepped Metal Surfaces", arXiv.org, e-Print Arch., Condens. Matter 2009, 1-21.
Yazyev, 0. V.; Pasquarello, A., "Effect of Metal Elements in Catalytic Growth of Carbon Nanotubes", Phys. Rev. Lett., Apr. 16, 2008, 100, (15), 156102/1-156102/4.
Yazyev, 0. V.; Pasquarello, A., "Carbon Diffusion in CVD Growth of Carbon Nanotubes on Metal Nanoparticles", Phys. Status Solidi B, Aug. 26, 2008, 245, (10), 2185-2188.
Zhu, X. Y.; White, J. M., "Interaction of Ethylene and Acetylene With Nickel(111): a SSIMS Study", Surf Sci., Dec. 6, 1989, 214, (1-2), 240-56.
Marinov, N. M. et al., "Modeling of Aromatic and Polycyclic Aromatic Hydrocarbon Formation in Premixed Methane and Ethane Flames", Combust. Sci. Techno.,1996, 116-117, (1-6), 211-287, Published Online: Oct. 24, 2007.
Ranzi, E. et al., "A New Comprehensive Reaction Mechanism for Combustion of Hydrocarbon Fuels", Combust Flame, Nov. 1994, 99(2), 201-11.
Wellmann, R. et al., "Growth of Graphene Layers on HOPG via Exposure to Methyl Radicals", Surf Sci., Sep. 10, 2003, 542(1-2), 81-93.
Chae et al, "Synthesis of Large-Area Graphene Layers on Polynickel Substrate by Chemical Vapor Deposition: Wrinkle Formation", Adv. Mater., Mar. 19, 2009, 21, 2328-2333.
De Arco et al, "Synthesis, Transfer, and Devices of Single-and Few-Layer Graphene by Chemical Vapor Deposition" IEEE Transactions on Nanotechnology, Mar. 2009, 8(2),135-138.
Mattevi et al, "A Review of Chemical Vapour Deposition of Graphene on Copper", Journal of Materials Chemistry, 2011, 21, 3324-3334, Published online: Nov. 10, 2010.
Gelperin et al, "Super-Sensing of Human and Environmental Odors", Report Documentation Page, Aug. 6, 2010, 1-8.

(56) References Cited

OTHER PUBLICATIONS

Levendorf et al, "Transfer-Free Batch Fabrication of Single Layer Graphene Transistors", Nano Letters, 9(12), Dec. 9, 2009, 4479-4480.
European Patent Application No. EP 11 81 7021: Supplementary European Search Report dated Jul. 29, 2015, 10 pages.
Cao et al., "Electronic transport in chemical vapor deposited graphene synthesized on Cu: Quantum Hall effect and weak localization", Applied Physics Letters, Mar. 24, 2010, vol. 96, No. 12, 122106-1-122106-3.

* cited by examiner

Figure 4A
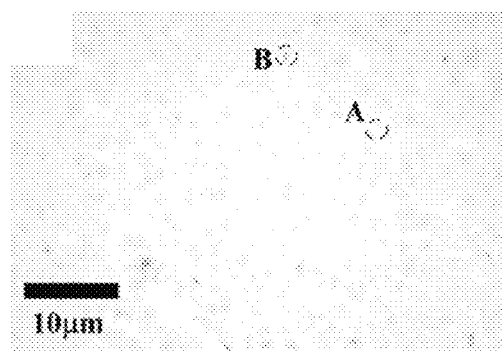
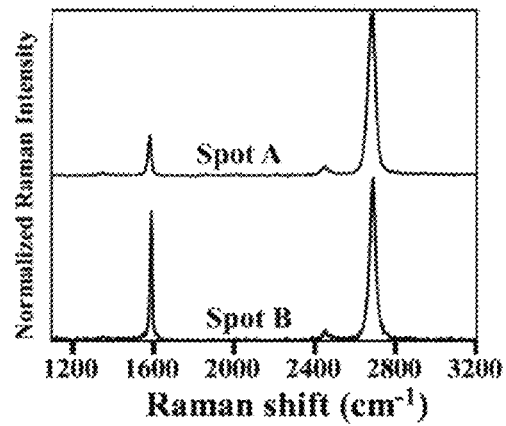
Figure 4B

Figure 4C
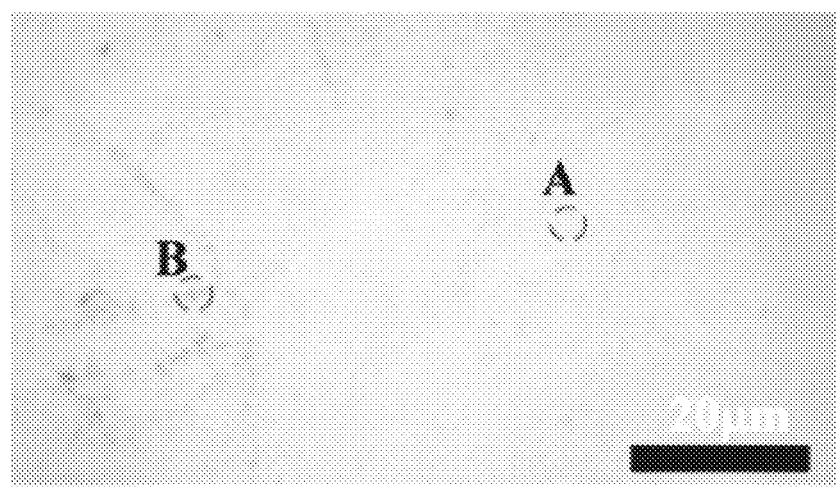
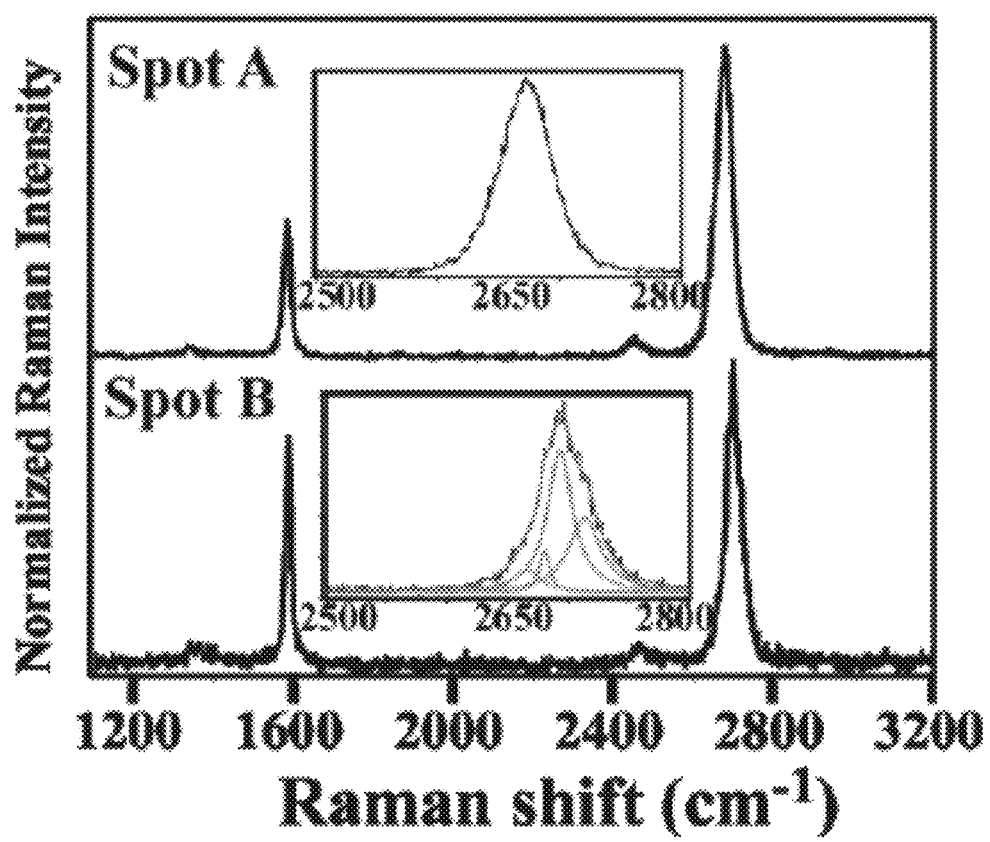
Figure 4D

Figure 8A
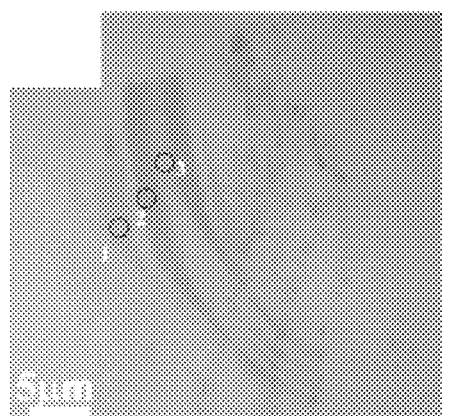
Figure 8B
Figure 8C
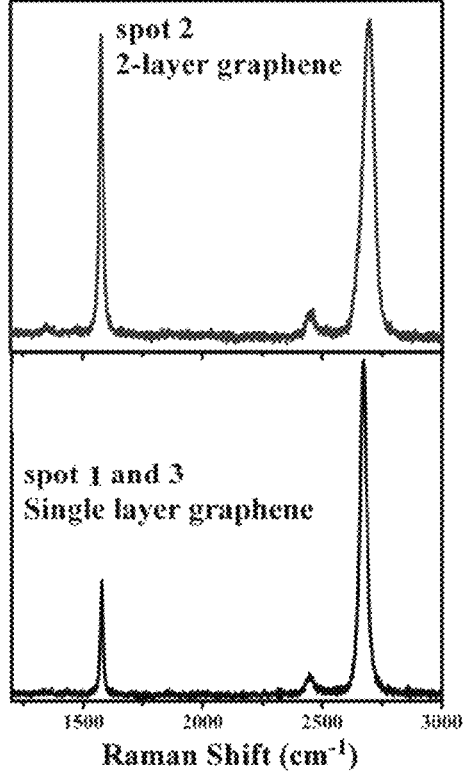

Figure 9A
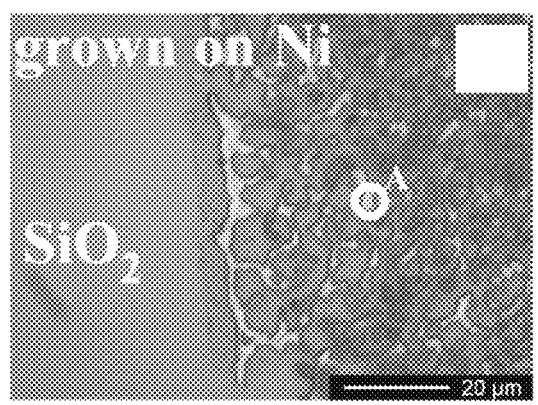
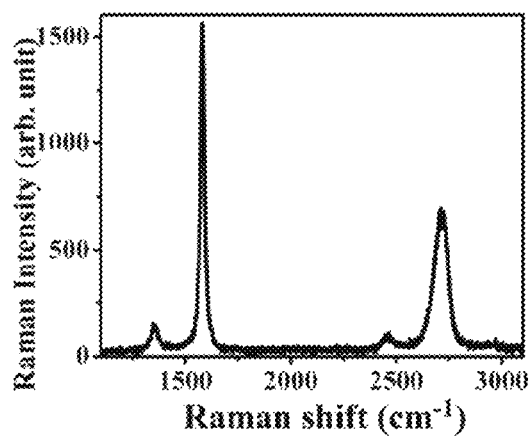
Figure 9B

LARGE-SCALE GRAPHENE SHEET: ARTICLES, COMPOSITIONS, METHODS AND DEVICES INCORPORATING SAME

CROSS-REFERENCE TO RELATED APPLICATIONS

This application is the National Stage of International Application No. PCT/US2011/047369, filed Aug. 11, 2011, which claims the benefit of U.S. Provisional Application No. 61/372,589 filed Aug. 11, 2010, the disclosures of which are incorporated herein by reference in their entireties.

STATEMENT OF GOVERNMENT SUPPORT

This invention was made with government support under Contract No. HR0011-09-C-0013, Amend 2, awarded by the Defense Advanced Research Products Agency (DARPA). The government has certain rights in the invention.

TECHNICAL FIELD

The present invention relates to the field of graphene materials and to the field of graphene synthesis.

BACKGROUND

Graphene has generated enormous interest in the research community because of its potential for use in electronic devices and other applications.

The desire for large-scale production of this material has motivated a number of recent investigations of methods to grow large-area single- (or few-) layer graphene by methods that include ultrahigh vacuum annealing of single crystal SiC, and other chemical vapor deposition methods. Existing methods, however, display substantial variation in the graphene's properties that are unacceptable for many applications—uniform thickness of graphene is a critical issue, but reports to date show only limited success in controlling this parameter. Accordingly, there is a need in the art for large-area single-layer graphene sheets and for related methods of producing such sheets.

SUMMARY

In meeting the described challenges, the claimed invention first provides growing a sheet of graphene atop a planarized metallic substrate. The claimed invention also provides compositions, which compositions include graphene sheets comprising at least about 80% single-layer graphene.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 4A-4D illustrate (FIG. 4A) an optical image of graphene grown on electropolished Cu with a methane feedstock concentration of 41 ppm; (FIG. 4B) Raman spectra taken from spots A and B shown in FIG. 4A; (FIG. 4C) optical micrograph of graphene grown on electropolished Cu with a methane feedstock concentration of 41 ppm and then transferred to an oxidized Si substrate; (FIG. 4D) Raman spectra taken at spots A and B in FIG. 4C; insets in FIG. 4D show details of the 2D band; the spectrum at point A is a single Lorentzian, indicating that this region is single layer graphene, while the 2D peak at point B is a convolution of four components, which indicates double layer graphene;

FIGS. 6A-6D illustrate several proposed, non-limiting reaction pathways, analogous to free radical polymerization, to explain graphene growth on uneven Cu metal surface during chemical vapor deposition, (FIG. 6A) dissociation of hydrocarbon on heated Cu surface; (FIG. 6B) nucleation and growth of graphene; (FIG. 6C) reaction termination when two active center react with each other; (FIG. 6D) final graphene with turbostatic structures and amorphorous carbon arising from surface roughness.

FIGS. 8A-8B illustrate (FIG. 8A) an optical micrograph of graphene obtained by micromechanical exfoliation of Kish graphite and deposited on a 300 nm silicon wafer, (FIG. 8B) Raman spectra of single and double layer graphene regions at spot 2 in Figure (FIG. 8A), and (FIG. 8C) Raman spectra of single-layer graphene from spots 1 and 3 in FIG. 8A; and FIGS. 9A-9B illustrate (FIG. 9A) optical images of graphene grown on Ni film and then transferred to 300 nm oxide silicon substrate, and (FIG. 9B) Raman spectrum of spot A in FIG. 9A.

DETAILED DESCRIPTION

Figure 1A:
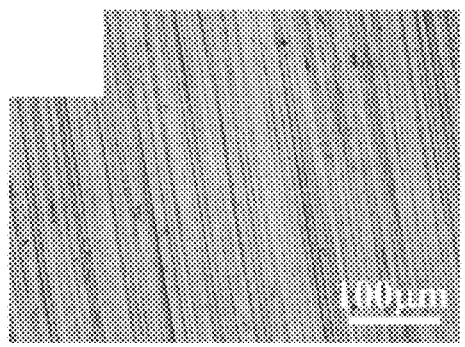
FIGS. 1A-1D illustrate optical images of (FIG. 1A, FIG. 1B) un-polished Cu foil and (FIG. 1C, FIG. 1D) CVD-graphene film grown on the Cu foil after transfer to an oxidized silicon substrate—the inset is a Raman spectrum taken at point A in FIG. 1D.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range. Any and all documents cited in this application are incorporated herein by reference in their entireties.

First provided are methods of fabricating graphenic material. These methods suitably include growing a sheet of graphene atop a planarized metallic substrate. The planarization is accomplished by mechanical polishing, chemical polishing, electropolishing, and the like. Chemical-mechanical polishing—known in the semiconductor industry—is considered suitable as well. Polishing with a mechanical device and a fluid or slurry (e.g., an abrasive slurry) is suitable. In some embodiments, the user may themselves planarize the substrate; in other embodiments, the user may purchase planarized substrate material.

As described elsewhere herein, electropolishing is considered especially suitable. The planarizing or polishing suitably reduces the roughness of the planarized metallic substrate is reduced by at least a factor of at least 2 relative to a non-planarized metallic substrate, or even by a factor of 5 or 10 relative to a non-planarized metallic substrate. In some embodiments, the roughness factor is improved by at least about 0.1, at least about 0.5, or even by at least about 1. In certain preferred embodiments, the planarized metallic substrate is atomically smooth. Atomically smooth metallic substrates are generally characterized as comprising a plane of metal atoms on the surface of the substrate. Suitable planes of metal atoms will generally comprising a single plane of metal atoms. Suitable metal atoms in the planes can be arranged in a planar array, e.g., like a facet of metal crystal. $$$$

In one electropolishing scheme, a metal work piece is immersed in an electrolyte and connected to the positive terminal (anode) of a power supply (e.g., a DC power supply). The negative terminal of the power supply is suitably attached to an auxiliary electrode (i.e., a cathode). Current passes from the anode, where metal on the surface of the workpiece is oxidized and dissolved in the electrolyte. Reduction (e.g., hydrogen evolution) takes place at the cathode. A variety of electrolytes may be used in electropolishing. Acid solutions (e.g., sulfuric acid, phosphoric acid, and mixtures thereof) are suitable. Other electropolishing electrolytes include perchlorates mixed with acetic anhydride and methanolic solutions of sulfuric acid.

Metallic substrates that are substantially nonreactive to hydrocarbon gas are suitable for the claimed methods. Substrates that promote the breakdown of hydrocarbon gas are especially suitable. Copper, rhodium, ruthenium, iridium, and the like are all suitable substrates. Commercially-available copper foil is considered especially suitable, as it may be electropolished to provide a suitably planar (i.e., reduced-roughness) substrate for the disclosed methods of graphene production. Rhodium, ruthenium, iridium, platinum, cobalt, and nickel are all considered suitable substrates. The substrate may include a single metal or a mixture or alloy of two or more metals. Other suitable substrate materials include metallic materials characterized by carbon solubility. Some of these materials include Fe/Cu, Ni/Cu, Co/Cu, and the like.

Growth of graphene is accomplished by contacting—under appropriate conditions—the substrate with a carbon-containing gas such as a hydrocarbon gas. The gas may be methane, ethane, or other hydrocarbons containing multiple carbons per molecule. The growth is suitably accomplished via chemical vapor deposition ("CVD"), wherein the hydrocarbon gas is contacted to the substrate in a reactor vessel. One exemplary embodiment of the CVD process is described elsewhere herein.

The contacting of the hydrocarbon gas to the substrate may take place at from about 50° C. to about 2000° C., or from about 100° C. to about 1500° C., or from about 500° C. to about 1100° C. The temperature may be maintained at around a specific set-point, or may be varied over the course of the process. For example, the temperature may be increased over the course of contacting hydrocarbon gas to the substrate, or the temperature may be reduced over the course of contracting the hydrocarbon gas to the substrate.

The hydrocarbon gas—such as methane—is suitably present at less than about 2000 ppm. The gas is also suitably present at less than about 1000 ppm, less than about 500 ppm, less than about 100 ppm, or even less than about 50 ppm. Without being bound to any particular theory, reducing the concentration of the hydrocarbon gas promotes the formation of single-layer graphene. Without being bound to any particular theory, this effect may be the result of a slower accumulation of carbon on the substrate that in turn allows for more deliberate assembly of carbon atoms atop the substrate. Higher concentrations of hydrocarbon gas may result in faster formation of carbon, which creates the possibility for more formation of few-layer graphene regions or regions of amorphous carbon.

The contacting or CVD process can be performed at or at around ambient pressure. In some embodiments, the process is performed at a pressure below ambient pressure, such as 0.7, 0.5, 0.2, 0.1 atm pressure. In other embodiments, the process is performed at a pressure greater than ambient pressure, such as 2 atm, 3 atm, 5 atm, 10 atm, or even greater pressures. In suitable embodiments a mixture of a non-reactive gas such as an inert gas such as argon and helium, or nitrogen, can be prepared with the carbon-containing gas. Thus, the methods of the present invention included atmospheric pressure CVD processes comprising the above-indicated low concentrations of a suitable carbon-containing gas and the balance a non-reactive gas.

The user may also remove or isolate the synthesized graphene from the substrate after sheet formation. This may be accomplished in a number of ways. In one isolation method, a protective film (e.g., PMMA) is applied via spin-coating or other deposition methods atop a graphene film that has been grown on the planarized (polished) side of a substrate. Solvent present in the film is removed as needed to leave behind a fully-formed protective film. The metal substrate—which may be present as a foil—is removed using a suitable etchant. All or part of the metal substrate may be removed. The protective film/graphene combination may then be moved or applied to another substrate, and the protective film may be removed by dissolving or application of a suitable etchant.

In some embodiments, the metal substrate is disposed atop an insulator or even atop a semiconductor. This may be accomplished by disposing the metallic material atop the semiconductor or insulator by CVD or other processes known to those of skill in the art for locating regions of metal atop a substrate. Silicon is considered a suitable substrate atop which metal may be placed. By placing metallic regions atop a semiconductor substrate followed by synthesis of graphene sheets atop the metallic regions, a user may create a device that includes semiconductor functionality along with the high conductivity of graphene.

The present invention also provides graphene sheet materials that include at least about 80% single-layer graphene. The composition may also include at least about 85% single-layer graphene, at least about 90% single-layer graphene, or even at least about 95% single-layer graphene. In some embodiments, the sheet is essentially entirely single-layer graphene.

The size of these sheets is essentially bounded by only the size of the substrate upon which the graphene is disposed. Because graphene synthesis is suitably performed in a reactor vessel—as described elsewhere herein—the limiting factor in the size of the graphene sheet can be the size of the reactor used for the synthesis. The graphene sheets may accordingly have a cross-sectional dimension (e.g., diameter, length, width) of several millimeters or even several centimeters. In some embodiments, the sheet has a characteristic dimension of at least 10 cm, at least about 25 cm, or even about 50 cm. Sheets of graphene may have a characteristic dimension of 100 cm or even longer, in some embodiments. Sheets may be linked together with conducting materials—including metals or other graphene—so as to create structures that include multiple graphene sheets.

The inventive graphene sheets suitably exhibit Raman spectra in which the ratio of the composition's Raman 2D band to the composition's Raman G band is at least about 2. The ration of these two bands may be 2.5, 3, 4, or even higher in some embodiments. The Raman 2D band of the compositions is suitably symmetric or very nearly symmetric. The compositions also suitably exhibit a Raman Stokes G peak at 1583 $cm^{-1}$ and a symmetric Raman 2D band around 2700 $cm^{-1}$. The graphene may also be characterized in terms of its hole mobility. The compositions suitably possess—at room temperature—a hole mobility of at least about 400 cm2/V-s, of at least about 500 cm2/V-s, of at least about 600 cm2/V-s, or even greater than 600 cm2/V-s.

The present invention also includes materials and devices made according to the foregoing methods. The foregoing methods and compositions may be incorporated into a range of devices. As one non-limiting example, the user may incorporated sheet graphene into touchscreens—graphene is an essentially transparent conductor, which makes it ideal for use in applications where a user desires a conductive overlay atop a display or input device. Graphene sheets are also structurally flexible, which in turn enables the production of flexible, bendable electronic devices. For example, a user may use graphene to produce a flexible display for a laptop or other computing device. The graphene sheet may also be used in transistors, including field-effect transistors. The sheets may also be incorporated into liquid crystal displays, organic photovoltaic cells, organic light-emitting diodes, and the like.

Experimental Results

Figure 1B:
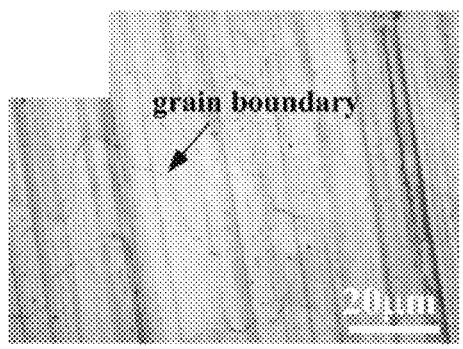

FIG. 1A and FIG 1B are optical images of an un-treated Cu foil under low and high magnification, respectively. The Cu surface shows a directional texture consisting of many parallel lines with spacing on the order of tens of micrometers. By adjusting the focal plane of the optical microscope, it has been verified that these grooves in the copper have a concave cross section, as reported by others. These striations are thought to be produced during the flat rolling process used to fabricate the Cu foil, with the lines running parallel to the shear/drawing direction. FIG. 1B also shows the presence of grains (typical size ~50 μm) and grain boundaries on the Cu surface.

Figure 1C:
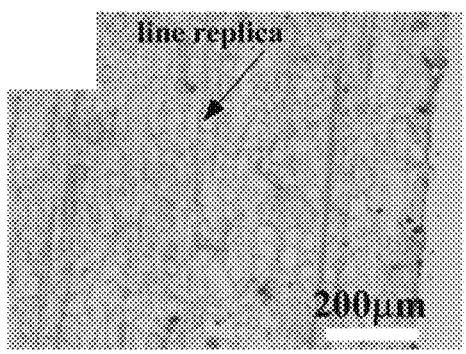
Figure 1D:
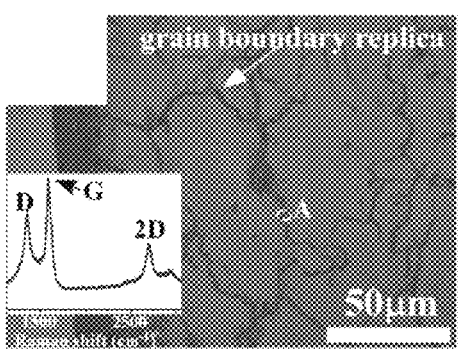

FIG. 1C and FIG. 1D are optical micrographs of graphene films that were grown by CVD on the same copper foil that is shown in FIG. 1A and FIG. 1B, and then transferred to an oxidized silicon wafer using the PMMA method. The color of the graphene film on the silicon wafer provides an estimate of the thickness of the graphene, with thicker regions appearing more blue (i.e., darker) in the optical image. Based on a careful comparison between the texture of the transferred graphene film (FIG. 1B) and the Cu foil surface texture (FIG. 1A), it is hypothesized that the latter is a replica of the former, where the thick part of the graphene corresponds to the deep trenches seen in the Cu surface. Based on a similar analysis of the higher magnification images (FIG. 1B and FIG. 1D), one may conclude that the finer grain boundary structures of the Cu foil (FIG. 1B) also lead to thickness variations in the graphene film. Some have interpreted similar features in CVD-grown graphene as "wrinkles" in the film due to the thermal expansion mismatch between Cu foil and graphene. This is inconsistent with the fact that the thicker graphene regions are found to lie predominately along a single direction. That the graphene structure reflects the topography of the catalytic Cu substrate offers a natural explanation for this observation. Moreover, as discussed below, these line and grain boundary replicas in the graphene are significantly reduced when a flat, electropolished Cu substrate is used for the growth.

Raman measurements of the graphene film regions that replicate the grain boundary and striated Cu regions indicate that carbon atoms in these areas are mostly in disordered $sp^3$-bonded networks as evidenced by the high intensity of the D band (~1350 $cm^{-1}$) and the very weak 2D band (~2700 $cm^{-1}$), shown in the inset of FIG. 1D. This observation that disordered carbon forms at grain boundaries of the catalytic Cu substrate differs from the highly ordered, multilayer graphene structures that form in grain boundary regions when Ni is used as the catalytic film, as verified herein (a Raman spectrum of Ni-catalyzed graphene grown in a grain boundary region is shown in FIG. 9). The formation of ordered graphene multilayers at grain boundaries on Ni catalytic substrates has been attributed to the fact that carbon atoms are attracted to step edges and other surface irregularities where they passivate metal edge atoms and nucleate graphene growth. Without being bound to any particular theory, these observations suggest that the mechanism of graphene growth on Cu foil differs significantly from the growth mechanism on Ni, with the growth of ordered graphene on Cu being less dependent on nucleation at step edges and/or surface irregularities.

Figure 2A:
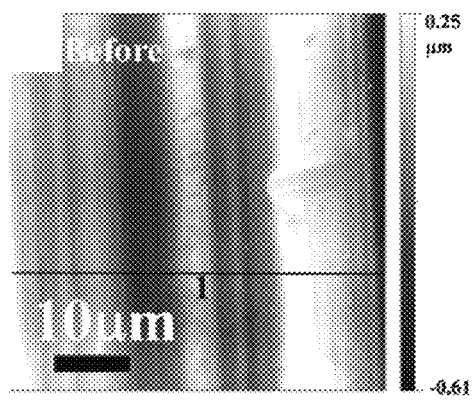
FIGS. 2A-2D illustrate AFM topography images of Cu foil (FIG. 2A) before and (FIG. 2B) after electropolishing, shown with the same height color scale—(FIG. 2C) illustrates line profiles of positions indicated in (FIG. 2A) and (FIG. 2B), and (FIG. 2D) illustrates a schematic diagram of the electropolishing setup.
Figure 2B:
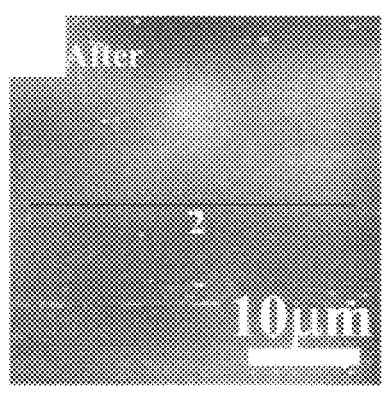
Figure 2C:
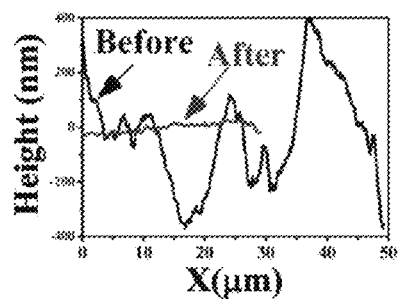

FIGS. 2A and 2B are AFM images illustrating how electropolishing greatly reduces the Cu foil surface roughness. The surface of the as-purchased foil (FIG. 2A) is very rough, showing trenches several hundred nanometers in depth and general texturing consistent with what is seen in the optical micrographs (FIGS. 1A-1B). After electropolishing, the roughness of the Cu surface is reduced (FIG. 2B) by a factor of 10-30, as evidenced by the line scans in FIG. 2C.

Figure 3:
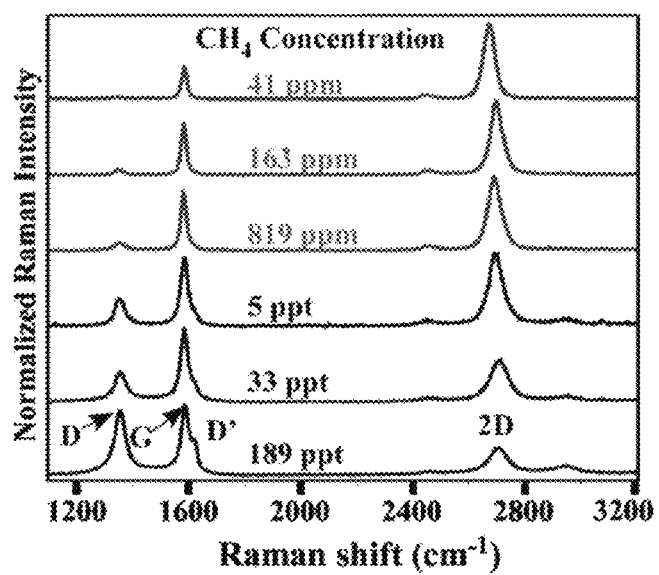
FIG. 3 illustrates Raman spectra of graphene grown on Cu foil by chemical vapor deposition and then transferred to a 300 nm oxide silicon substrate using PMMA method (see full text for details)—the Raman spectra of graphene grown on unpolished Cu foil are shown by the three lower curves, and the spectra of graphene grown on electropolished Cu foil are depicted as the upper three curves, respectively.

The concentration of hydrocarbon gas is another factor in controlling the graphene thickness and homogeneity. FIG. 3 shows Raman spectra from graphene samples grown using different methane concentrations and transferred by the PMMA method onto an oxidized silicon substrate. The three higher methane concentration samples (lower three curves in FIG. 3) were grown on unpolished Cu samples, while the other three lower methane concentrations were grown on polished Cu foil (upper three curves). A growth time of 20 minutes was used for the samples grown at the two lowest methane concentrations (41 ppm and 163 ppm) to enable high graphene coverage, while the growth time for each of the other samples was 10 minutes. All plotted spectra are the average of 5 spectra taken at regions deemed to be the most uniform and thinnest parts of the film to avoid Raman changes associated with variation in the graphene thickness. No sizable single layer graphene region was found when the methane concentration exceeded 5 ppt (parts per thousand).

The D-peak in the Raman spectra of FIG. 3 can be used to estimate the disorder present in the sample; as shown in FIG. 3, decreased methane concentration resulted in samples with smaller D-peaks and hence less disorder. Single-layer, quality graphene may also be characterized by a Raman spectrum wherein the G-peak (while present) is small relative to the 2D peak. Such a spectrum is shown by the 41 ppm methane sample, which exhibits a comparatively large ratio of 2D-peak to G-peak. High-quality graphene is also characterized by little to no D' peak (which may appear as a 'shoulder' on the G-peak).

Three major bands in the Raman spectrum of graphitic materials are typically used to infer structural information: 1) D-("disorder") band at ~1350 cm$^{-1}$; as well as D' band, i.e side-band at ~1620 cm$^{-1}$; the relative intensity of these peaks reflects the degree of disorder, or relative sp$^3$ carbon content, in the carbon structure; 2) G-band at ~1583 cm$^{-1}$; 3) 2D or G' band at ~2670 cm$^{-1}$, which is the second harmonic of the D band. Single layer graphene is known to exhibit a single highly symmetric 2D band, while the 2D band for two- or few-layer graphene exhibits an asymmetric peak consisting of multiple Lorentzian components. In addition, the relative intensity of the 2D and G bands is an indication of the film thickness of an un-doped graphene sample; single layer graphene has higher 2D intensity (typically $I_{2D}/I_G>2$).[11]

When CVD growth is done with a methane concentration greater than 5 ppt, no sizable single layer graphene regions are observed, and the sample has a large D band and significant D' sideband. Without being bound to any particular theory, when high methane concentration is used, thick graphitic regions with significant sp$^3$ defect content are formed on the Cu foil surface. The defect density, as reflected by the relative D-band intensity, decreases as the methane concentration is reduced, and is accompanied by a significant decrease in the average thickness of the graphene film. This dependence of the growth process on the reactant concentration suggests that growth kinetics are a factor in the properties of the graphene.

FIG. 4 shows an optical image of graphene film synthesized with 41 ppm methane on an electro-polished Cu foil. Of the Raman spectra taken from 30 random locations, only two type of spectra were seen, i.e. Raman spectra similar to those at spot A and B, that resemble those collected from single and double layer of exfoliated pristine graphite, respectively (see FIG. 8 for Raman spectra of single and double layer graphene generated by exfoliation). (Spot B is few-layer graphene.) Based on the analysis of optical micrographs of the sample, and the known optical contrast between single and double layer graphene, single layer graphene constitutes at least 95% of the sample grown in an atmosphere containing 41 ppm methane. A uniform thin film was formed on the entire copper surface, regardless of the grain orientation, suggesting that the graphene growth is not necessarily controlled by Cu crystal orientation.

Figures 5A, 5B:
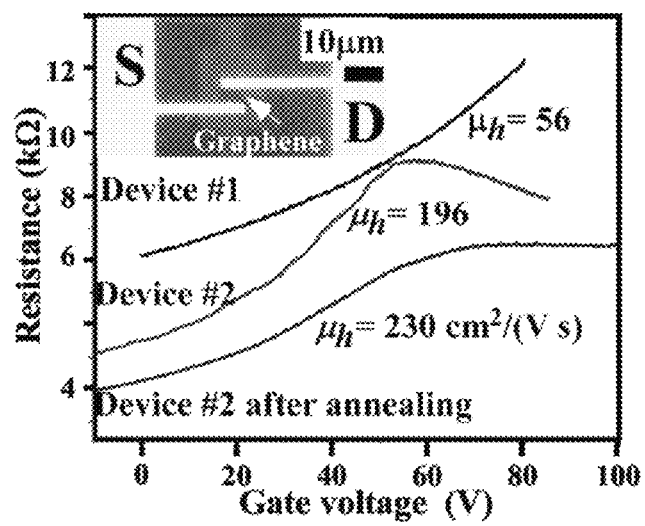
FIGS. 5A-5B illustrate resistance as function of gate voltage for typical graphene FET devices fabricated on single layer graphene that were grown on (FIG. 5A) as-obtained and (FIG. 5B) electropolished Cu foil—the inset is an optical micrograph of a graphene FET device.

FIGS. 5A and 5B are plots of the resistance as a function of gate voltage for typical graphene FET devices fabricated on single layer graphene grown on as-received and electropolished Cu foil, respectively, with a methane concentration of 41 ppm. The room temperature hole mobility for graphene samples grown on electropolished Cu foil (400-600 cm$^2$/V-s) is significantly enhanced over the mobility of graphene grown on as-received Cu foil (50-200 cm$^2$/V-s). This observation is consistent with the hypothesis that carrier scattering is associated with the disordered carbon regions that form in the graphene film due to surface roughness of the Cu foil. The disordered carbon content is significantly reduced when polished Cu is used as the catalyst, and further reduced by the use of a low methane concentration in the growth atmosphere.

The disclosed growth process, which can be followed by transfer to arbitrary substrates, has great potential to be made compatible with industrial microfabrication processes for large-scale integration of graphene devices. One way to further increase the conductivity and mobility of the devices is by sample annealing. As shown in FIG. 5A, the resistance vs. gate voltage characteristic measurement on device 2 shows that the mobility of the device is significantly enhanced by annealing, while its overall resistance is reduced. FIG. 5B shows that the "peak" feature of the device's resistance behavior has become more pronounced—the peak and the ratio of the maximum and minimum of the resistance trace are both suggestive of the electronic quality of the material.

Two mechanisms have been suggested to understand the formation of graphitic carbon on metal surfaces: 1) dissolution-precipitation, or segregation, process, where carbon is solubilized in the metal film and then precipitates out in a low energy form upon cooling; and 2) chemical vapor deposition process, which mainly includes adsorption and disassociation of precursor molecules on the surface where the graphitic material grows, with minimal dissolution of carbon in the metal film.

Due to the extremely low solubility of carbon in Cu, it may be that graphitization is dominated by the chemical vapor deposition process for Cu-catalyzed growth. Moreover, recent first-principles modeling of graphene growth on different metals shows that the Cu-catalyzed process differs strongly from the growth on other metals. First principles calculations indicate that, in contrast to graphene growth on other metals, Cu-catalyzed graphene growth is unique in that surface irregularities (i.e., metal step edges and other defects) do not serve as centers for carbon adsorption and growth nucleation. Instead, nucleation is found to proceed readily on the crystal plane. Carbon adatoms are found to interact mainly with free-electron-like surface states in Cu, while they strongly bind to other metal surfaces through orbital hybridization, leading to a comparatively weak surface diffusion barrier on the Cu surface. A direct consequence of this difference is that carbon-carbon interactions dominate the growth on Cu, since carbon dimers more stable than isolated C adatoms by over 2 eV, while carbon-carbon coupling is energetically unfavorable on other metal surfaces.

The high reactivity and relative independence to the environment characteristic of hot carbon adatoms on Cu closely resemble the properties of carbon free radicals. Some suggest that different radical species are formed on metal surfaces when hydrocarbons are heated to high temperature; other suggest graphene growth can proceed from methyl radicals.

Figure 6A:
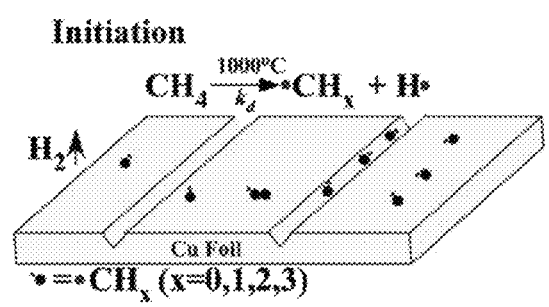
Figure 6B:
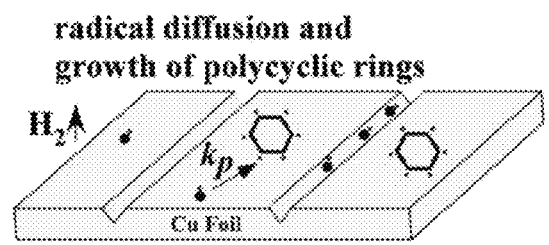
Figure 6C:
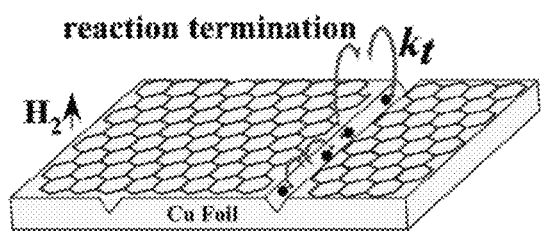

Consequently, the question that arises is whether the hot adatom nucleation and graphene growth on the copper surface can be modeled as free radical chain polymerization involving the following three stages: 1) initiation, 2) propagation and 3) reaction termination (FIG. 6). In the initiation stage, methane adsorbs on the Cu surface at elevated temperature, and hydrogen atom(s) dissociate from the methane molecules, yielding reactive carbon radicals on both the uniform crystal terraces and any surface irregularities (step edges, large scale striations, etc.). In all stages of the growth, hydrogen radicals released by hydrocarbon species will recombine and form hydrogen gas molecules. In the chain (plane) growth stage, surface carbon radicals diffuse along the Cu surface and form polycyclic hydrocarbon structures, whose reactive edge atoms serve as growth seeds for the resulting graphene film. Carbon radicals on smooth film regions diffuse readily, enabling the formation of a graphitic $sp^2$ bonded network.

In contrast, radicals trapped in "valleys" on the metal surface and other irregularities lack the surface mobility required to form large-scale graphene structures, leading to the formation of defected, $sp^3$ bonded networks as the reaction terminates. Because the molecular weight of the formed polymer (graphene in this case) is proportional to the ratio of the rate of chain (here, plane) growth[28] ($R_p$ with $k_p$ as chain propagation constant) to reaction termination ($R_t$ with $k_t$ as chain termination constant), i.e. graphene size~$k_p/k_t$, one expects that only small graphene fragments or amorphous carbon will form in surface irregularities associated with grain boundaries and surface textures. Once a completely intact single layer graphene film forms on the Cu surface, lack of access to the catalytic surface will lead to suppression of methane into free radicals; this leads to a significant change in the deposition mechanism, inhibiting the formation of a second graphene layer.

Experimental

Gases, including methane (purity 99.999%), Argon (99.999%) and hydrogen (99.999%) are purchased from GTS-Welco Inc. Cu foil (50 or 25 μm thick) were purchased from Alfa Aesar Inc or McMaster-Carr Inc Immediately before graphene growth, Cu foils are cleaned by sonicating in acetic acid for 5 minutes to remove the oxide layer. Solvents, including 100% ethanol, acetone, chemicals such as $FeCl_3.6H_2O$ and HCl, and all other chemicals if not specified are purchased from Thermo Fisher Scientific Inc. All chemicals, if not specified, are used without further purification.

Electropolishing

Figure 2D:
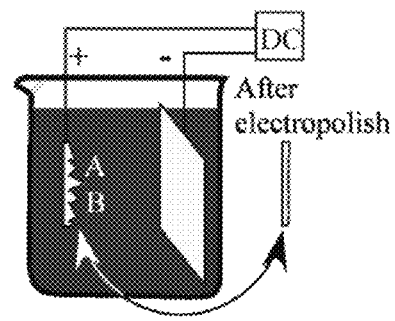

The copper foil was electropolished using a home-built electrochemistry cell (FIG. 2d). The copper surface was first rough polished with sand paper, then with fine metal polish paste, followed by cleaning in ethanol with sonication. The dried Cu foil was then soldered to a metal wire, and covered with silicone gel on the back, edges and corners. The Cu foil was then placed into an 800 ml beaker, containing a solution of 300 ml $H_3PO_4$ (80%) and 100 ml PEG (molecular weight 400, from Sigma Aldrich Co.). The Cu foil and a large Cu plate were used as work (+) and counter (−) electrode, respectively. A voltage of 1.5-2.0 V was maintained for ~0.5 hours during the polishing process. Immediately after polishing, the Cu foil was washed with large amount of de-ionized water, with sonication. Any remaining acid on the metal surface was further neutralized by 1% ammonia solution and washing with ethanol, followed by blow-drying with $N_2$. The silicone gel was then cut or removed. The clean Cu foil was stored in ethanol to prevent later oxidation by air. The smoothing mechanism of the electropolishing process mainly relies on the fact that the current density (and thus the etch rate) varies across the anode surface, and is higher at protruding regions with high curvature (e.g. point A in FIG. 2D) compared to other areas (point B); thus the surface of the copper foil is smoothed and leveled by the electropolishing.

Atomic Force Microscopy

AFM imaging was conducted with tapping mode on DI 3000 (Digital Instruments Inc.).

Chemical Vapor Deposition Growth of Graphene Films

CVD growth of graphene was carried out in a furnace with a 1-inch quartz tube as reaction chamber. A typical growth consisted of the following steps: (1) load the cut Cu foil into the quartz tube, flush the system with Ar (600 sccm)/$H_2$ (10 sccm if not specified) for 10 minutes, then continue both gas flows at these rates through the remainder of the process; (2) heat the furnace to 800° C., anneal the Cu foil for 20 minutes to remove organics and oxides on the surface; (3) raise the temperature to 1000° C., then start the desired methane flow rate as described elsewhere herein; (4) after reaching the reaction time, push the quartz tube out of the heating zone to cool the sample quickly, then shut off the methane flow. The sample was unloaded after cooling to room temperature.

PMMA Method for Graphene Film Transfer

This method may be used to transfer the graphene to a substrate that is resistant to acetone. A protective thin film of ~300 nm polymethylmethacrylate (PMMA C4 950, from Microchem Corp.) was spin-coated on graphene film that was grown on the polished side of the Cu growth substrate, followed by baking at 160° C. for 20 minutes to remove the solvent. Graphene on the back (unpolished) side of the Cu substrate was removed by an oxygen reactive ion etch (RIE) at a power of 45 W for 2-5 minutes. The sample was then floated on a solution of 0.05 g/ml iron chloride held at 60° C. with the exposed Cu side facing downwards. The Cu was gradually etched away over 3 to 10 hours. The graphene/PMMA film was washed by transferring into a Petri-dish containing de-ionized water, then floated on 1N HCl solution and kept for 0.5 h, and transferred to a Petri-dish with de-ionized water for another wash. The film was then scooped onto an oxidized silicon wafer (300 nm oxide thickness), with the PMMA side up. The sample was gently blown-dry, and heated to 70° C. for ~30 minutes to dry. To enable better adhesion of the film to the substrate, another layer of PMMA was applied to the sample surface, followed by baking at 160° C. for 20 minutes. Finally, the PMMA protective layers were removed by immersing the sample overnight in a large volume of acetone at 55° C.

PDMS Stamp Method for Graphene Film Transfer

This method using a PDMS stamp was used to transfer the graphene to an arbitrary substrate. 20 parts of Sylgard 184 pre-polymer and 1 part of curing agent were weighed in a plastic cup. The components were fully blended by stirring for 2 minutes until the mixture was filled with bubbles; the bubbles were then removed by vacuum de-gasing. The mixture was poured slowly onto the surface of a graphene/Cu foil sample (polished side face up) in a Petri-dish, and the PDMS was then cured in vacuum oven at 70° C. for 1 hour. A sharp scalpel was used to cut around the foil. This was followed by removal of the graphene on the back (unpolished) side of the Cu foil by an oxygen reactive ion etch (RIE) at a power of 45 W for 2-5 minutes. The sample was then floated on 0.05 g/ml iron chloride solution held at 60°

Figure 7:
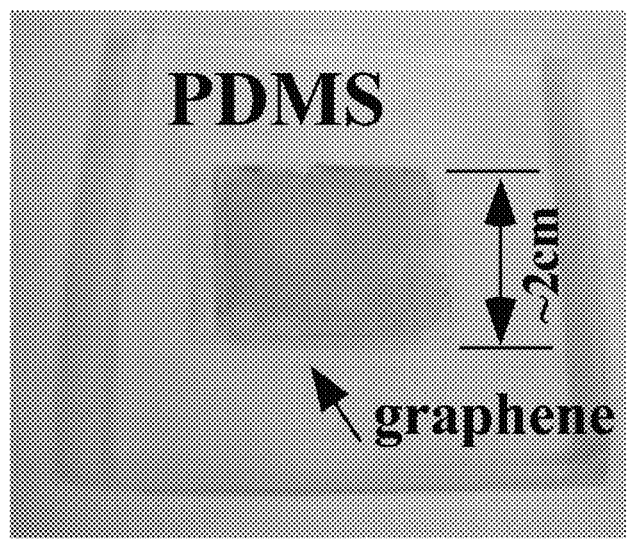
FIG. 7 illustrates (via photograph) a graphene sample that has been transferred onto a PDMS stamp.

C. with the Cu side facing downwards. The Cu was etched away over 3 to 10 hours, followed by cleaning in copious amount of de-ionized water, then 1N HCl solution, then copious amount of de-ionized water again. After the stamp was gently blown dry, it was placed face down on a substrate, and uniform pressure was applied across the entire surface of the stamp for several seconds. The stamp was then lifted off, leaving behind the graphene film on a new substrate. An example of a sample transferred by this method is shown in FIG. 7.

Raman Spectroscopy

Raman spectra of graphene samples on $SiO_2$/Si or PDMS substrates were obtained using a 514 nm excitation wavelength laser under a 100× objective. The laser power was kept below 4 mW to avoid damaging the sample. Single layer graphene was identified by its unique Raman signatures, i.e. it has the Stokes G peak at 1583 $cm^{-1}$ and a single symmetric 2D band around 2700 $cm^{-1}$ (see FIG. 8 for representative Raman spectrum of single and double layer graphene films).[16]

Graphene FET Transistor Fabrication Using Electron Beam Lithography

Metal source and drain electrodes, and graphene ribbons were patterned by electron beam lithography using PMMA as e-beam resist. First, optical microscopy was used to locate a single layer graphene film on a 300 nm oxide silicon substrate of pre-fabricated alignment markers. A 300 nm thick PMMA (PMMA C4 950, from Microchem Corp) film was applied by spin coating using a standard procedure and parameters provided by the manufacturer. Electron-beam patterning was done using a JOEL SEM 6400 operated at 30 kV with a Raith Elphy Plus controller, at an exposure dose of 500 μA/$cm^2$, followed by developing in a 1:3 solution of methyl isobutyl ketone (MIBK, Microchem Corp.) and isopropyl alcohol. Chromium (3 nm) and gold (50 nm, both from R. D. Mathis Co.) were then deposited onto the substrate in a thermal evaporator at a pressure of $10^{-7}$ Torr. The deposited films were lifted off in an acetone bath for 12 h at 70° C. and rinsed extensively with isopropyl alcohol. With the electrical contacts thus fabricated, another electron beam lithography step identical to the one just described and an oxygen reactive ion etch were used to pattern isolated channels of graphene connecting each pair of source and drain electrodes.

Electronic Transport Measurements

Devices were created in three-terminal transistor geometry, where the p++ doped silicon wafer was used as a global back gate. Source, drain and gate electrodes were contacted using individual probes in a custom-made, small-signal probe station, controlled using Labview. A data acquisition card (National Instruments) was used to output source-drain voltage, and a Keithley 6517A current meter was used to read the source-drain current and to output the gate voltage.

Described herein are methods to grow uniform, large-size graphene film using chemical vapor deposition on planarized (e.g, electropolished) substrates. A very flat surface morphology and low carbon gas (e.g., methane) concentration in the CVD atmosphere influenced homogeneity and electronic transport properties of the resulting graphene material. By tuning these parameters, one can obtain graphene samples with single layer content exceeding 95%. Field effect transistors fabricated on such graphene samples show room temperature hole mobilities enhanced by a factor of 2-5 compared to those grown on unpolished Cu substrates. Based on a kinetic model for graphene growth inspired by free radical chain polymerization, it is proposed that the termination stage of the growth is dominated by high concentration of trapped radical in the valley of Cu surface compared to the flat regions, causing the valleys to contain larger amounts of amorphous or turbostatic carbon and graphene fragments.

What is claimed:

1. A method of fabricating graphenic material, comprising:
    growing a sheet of graphene atop an electropolished metallic substrate by contacting the substrate with a hydrocarbon gas at a concentration of less than about 2000 ppm, the contacting being performed such that the resulting graphenic material comprises greater than 95% single layer graphene.

2. The method of claim 1, wherein the metallic substrate is substantially nonreactive to carbon.

3. The method of claim 1, wherein the metallic substrate comprises copper, rhodium, ruthenium, iridium, platinum, cobalt, nickel, or any combination thereof.

4. The method of claim 3, wherein the metallic substrate comprises copper.

5. The method of claim 3, whereby the room temperature hole mobility of the graphenic material is from about 400 to about 600 $cm^2$/V-s.

6. The method of claim 1, wherein the graphene sheet has a cross-sectional dimension of at least about 25 cm.

7. The method of claim 1, wherein the contacting occurs at from about 50° C. to about 2000° C., about 100° C. to about 1500° C., or about 500° C. to about 1100° C.

8. The method of claim 1, wherein the hydrocarbon gas is present at less than about 50 ppm.

9. The method of claim 1, wherein the contacting occurs at atmospheric pressure.

10. The method of claim 1, further comprising isolating the graphene sheet.

11. The method of claim 10, wherein the isolating comprises removing at least a portion of the metallic substrate so as to expose at least a portion of the graphene sheet.

12. The method of claim 1, wherein the metallic substrate is disposed atop an insulator or a semiconductor.

13. The method of claim 12, wherein the semiconductor comprises silicon.

14. The method of claim 1, wherein the roughness of the planarized metallic substrate is reduced by at least a factor of at least 2, or at least 5, relative to a non-planarized metallic substrate.

15. A graphene sheet or layer made according to claim 1.

* * * * *